(12) United States Patent
Bode et al.

(10) Patent No.: US 6,810,296 B2
(45) Date of Patent: Oct. 26, 2004

(54) CORRELATING AN INLINE PARAMETER TO A DEVICE OPERATION PARAMETER

(75) Inventors: Christopher A. Bode, Austin, TX (US); Gregory A. Cherry, Austin, TX (US); Rick Good, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/254,209

(22) Filed: Sep. 25, 2002

(65) Prior Publication Data

US 2004/0059456 A1 Mar. 25, 2004

(51) Int. Cl.[7] .............................................. G06F 19/00
(52) U.S. Cl. ...................... 700/110; 700/121; 700/33; 700/44; 702/84
(58) Field of Search ............................ 700/33, 44, 45, 700/97, 108–110, 121; 438/14; 702/81, 82, 84

(56) References Cited

U.S. PATENT DOCUMENTS

| | | | | |
|---|---|---|---|---|
| 3,614,640 A | * | 10/1971 | Wolf ............................ | 327/47 |
| 4,578,648 A | * | 3/1986 | Werrbach .................... | 330/281 |
| 5,396,433 A | * | 3/1995 | Kosugi ........................ | 364/468 |
| 5,482,881 A | * | 1/1996 | Chen et al. .................. | 437/43 |
| 5,810,928 A | * | 9/1998 | Harada et al. ............... | 118/690 |
| 5,838,445 A | * | 11/1998 | Sandhu et al. .............. | 356/371 |
| 6,020,264 A | * | 2/2000 | Lustig et al. ................ | 438/692 |
| 6,409,576 B1 | * | 6/2002 | Oguri et al. .................... | 451/6 |
| 6,486,492 B1 | * | 11/2002 | Su .............................. | 257/48 |
| 6,594,598 B1 | * | 7/2003 | Ishizuka et al. .............. | 702/84 |
| 6,638,778 B1 | * | 10/2003 | Peterson et al. .............. | 438/14 |
| 2002/0051567 A1 | * | 5/2002 | Ganz et al. .................. | 382/152 |
| 2002/0082738 A1 | * | 6/2002 | Goldman et al. ........... | 700/109 |
| 2002/0088952 A1 | * | 7/2002 | Rao et al. .............. | 250/559.45 |
| 2002/0192966 A1 | * | 12/2002 | Shanmugasundram et al. .......................... | 438/692 |
| 2003/0097198 A1 | * | 5/2003 | Sonderman et al. ........ | 700/110 |

OTHER PUBLICATIONS

Wan, "Comparison of self–aligned and non–self–aligned E/D MESFETs" May 1989, Electron Devices, vol. 36, Issue 5, pp. 839–845.*

Bloom, "2–Bit Cell NV Memory Minimizes Chip Area with Less Masks" Jan. 2002, Nikkei Business Publications, Inc.*

\* cited by examiner

Primary Examiner—Sean Shechtman
(74) Attorney, Agent, or Firm—Williams, Morgan & Amerson, P.C.

(57) ABSTRACT

A method and an apparatus for dynamic targeting for a process control system. Inline parameter data relating to a processed workpiece is received. A determination is made whether the inline parameter would result in a value of a device operation parameter within a predetermined range. At least one process operation performed upon the workpiece is adjusted in response to a determination that the inline parameter would not result in a value of the device operation parameter.

30 Claims, 9 Drawing Sheets

CORRELATING AN INLINE PARAMETER TO A DEVICE OPERATION PARAMETER

BACKGROUND OF THE INVENTION

1. Field of the Invention

This invention relates generally to semiconductor manufacturing, and, more particularly, to a method and apparatus for a modeling inline parameters to a device operation parameter relating to a device.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a typical flow of processes performed on a semiconductor wafer 105 by a semiconductor manufacturing system is illustrated. Generally, semiconductor wafers 105 are processed based upon a predetermined process flow by a manufacturing system (block 210). Upon processing at least one semiconductor wafers 105, metrology data is generally acquired (block 220). Upon acquiring the metrology data, the manufacturing system may perform a metrology data analysis function to analyze errors that may occur on the processed semiconductor wafers 105 (block 230). Based upon the metrology data analysis, the manufacturing system may perform adjustments to processing operations performed by the manufacturing system (block 240).

Utilizing the prior art process flow implemented by current manufacturing systems, a lot of semiconductor wafers 105 may be processed through several process steps without a substantial focus on the performance characteristics of devices produced from the processed semiconductor wafers 105. In other words, a lot of semiconductor wafers 105 may be pushed through a string of manufacturing processes based on available data, without an adequate focus on several device operation parameters relating to devices produced from the processed semiconductor wafers 105. For example, the data access time, such as erase time, relating to a memory device may be affected by the processing flow of a process flow of semiconductor wafers 105. The operation of a logic device, such as a memory device may be greatly affected by several inline processing operations. Without an adequate focus on how one or more inline parameters may affect device operation, efficient production of devices made from the semiconductor wafers 105 may be adversely affected.

The present invention is directed to overcoming, or at least reducing, the effects of, one or more of the problems set forth above.

SUMMARY OF THE INVENTION

In one aspect of the present invention, a method is provided for correlating an inline parameter to a device operation parameter of a device. Inline parameter data relating to a processed workpiece is received. A determination is made whether the inline parameter would result in a value of a device operation parameter within a predetermined range. At least one process operation performed upon the workpiece is adjusted in response to a determination that the inline parameter would not result in a value of the device operation parameter within a predetermined range.

In another aspect of the present invention, a method is provided for correlating an inline parameter to a device operation parameter of a device. Inline parameter data relating to a processed workpiece is received. The inline parameter data may include a shallow isolation trench critical dimension, a tunnel oxidation parameter, a source/drain critical dimension, a film stack measurement, a post etch critical dimension measurement, or a wafer electrical test parameter, all relating to the processed workpiece. A determination is made whether the inline parameter would result in a value of a device operation parameter within a predetermined range. At least one process operation performed upon the workpiece is adjusted in response to a determination that the inline parameter would not result in a value of the device operation parameter within a predetermined range.

In another aspect of the present invention, a method is provided for correlating an inline parameter to a device operation parameter of a device. Inline parameter data relating to a processed workpiece is received. The inline parameter data may include a shallow isolation trench critical dimension, a tunnel oxidation parameter, a source/drain critical dimension, a film stack measurement, a post etch critical dimension measurement, or a wafer electrical test parameter, all relating to the processed workpiece. A determination is made whether the inline parameter would result in an erase time value relating to a memory device that is within a predetermined range. At least one process operation performed upon the workpiece is adjusted in response to a determination that the inline parameter would not result in an erase time value relating to the memory device within a predetermined range.

In another aspect of the present invention, a system is provided for correlating an inline parameter to a device operation parameter of a device. The system comprises a processing tool and a process controller operatively coupled to the processing tool. The processing tool processes a workpiece. The process controller is adapted to receive inline parameter data relating to the processed workpiece and determine whether the inline parameter would result in a value of a device operation parameter within a predetermined range. The process controller is also adapted to adjust at least one process operation performed upon the workpiece in response to a determination that the inline parameter would not result in a value of the device operation parameter.

In another aspect of the present invention, an apparatus is provided for correlating an inline parameter to a device operation parameter of a device. The apparatus comprises a process controller to control a process operation performed on a workpiece. The process controller is adapted to receive inline parameter data relating to the processed workpiece and determine whether the inline parameter would result in a value of a device operation parameter within a predetermined range. The process controller is also adapted to adjust at least one process operation performed upon the workpiece in response to a determination that the inline parameter would not result in a value of the device operation parameter.

In yet another aspect of the present invention, a computer readable program storage device encoded with instructions is provided for correlating an inline parameter to a device operation parameter of a device. The computer readable program storage device encoded with instructions that, when executed by a computer, performs a method, which comprises receiving inline parameter data relating to a processed workpiece; determining whether the inline parameter would result in a value of a device operation parameter within a predetermined range; and adjusting at least one process operation performed upon the workpiece in response to a determination that the inline parameter would not result in a value of the device operation parameter.

BRIEF DESCRIPTION OF THE DRAWINGS

The invention may be understood by reference to the following description taken in conjunction with the accompanying drawings, in which like reference numerals identify like elements, and in which.

Figure 1:
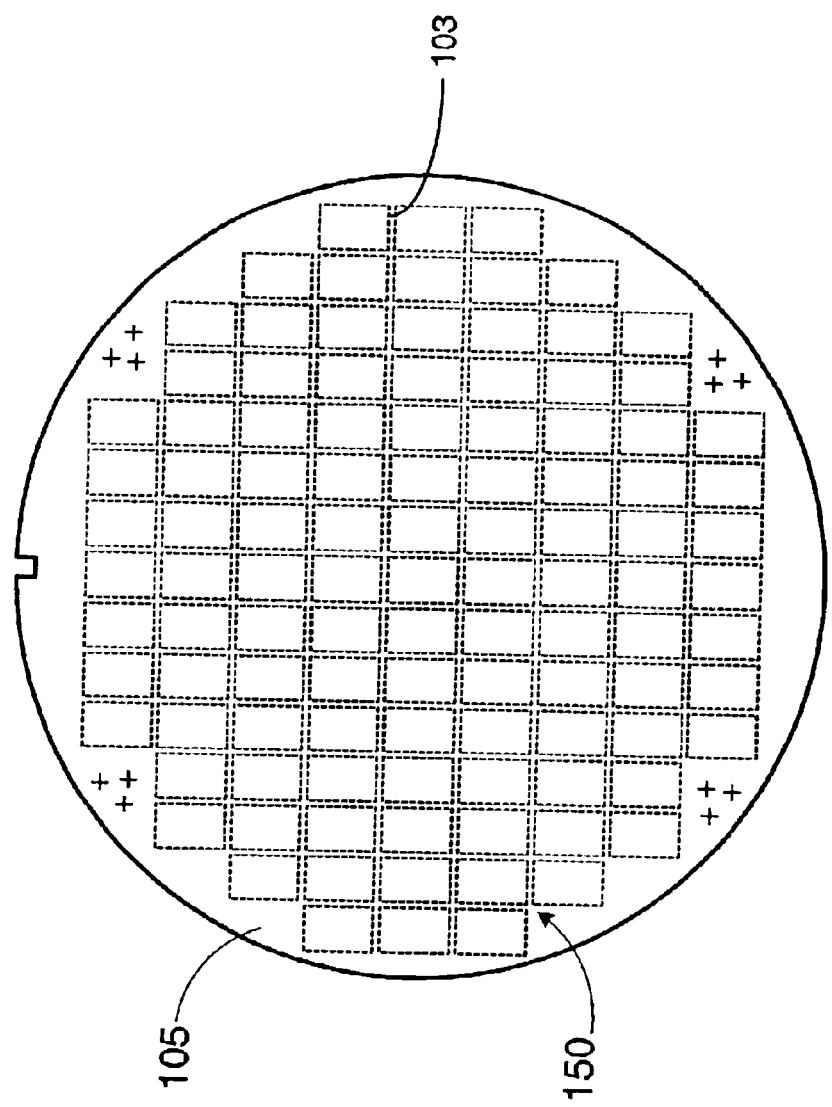
FIG. 1 is a simplified diagram of a prior art semiconductor wafer being processed.
Figure 2:
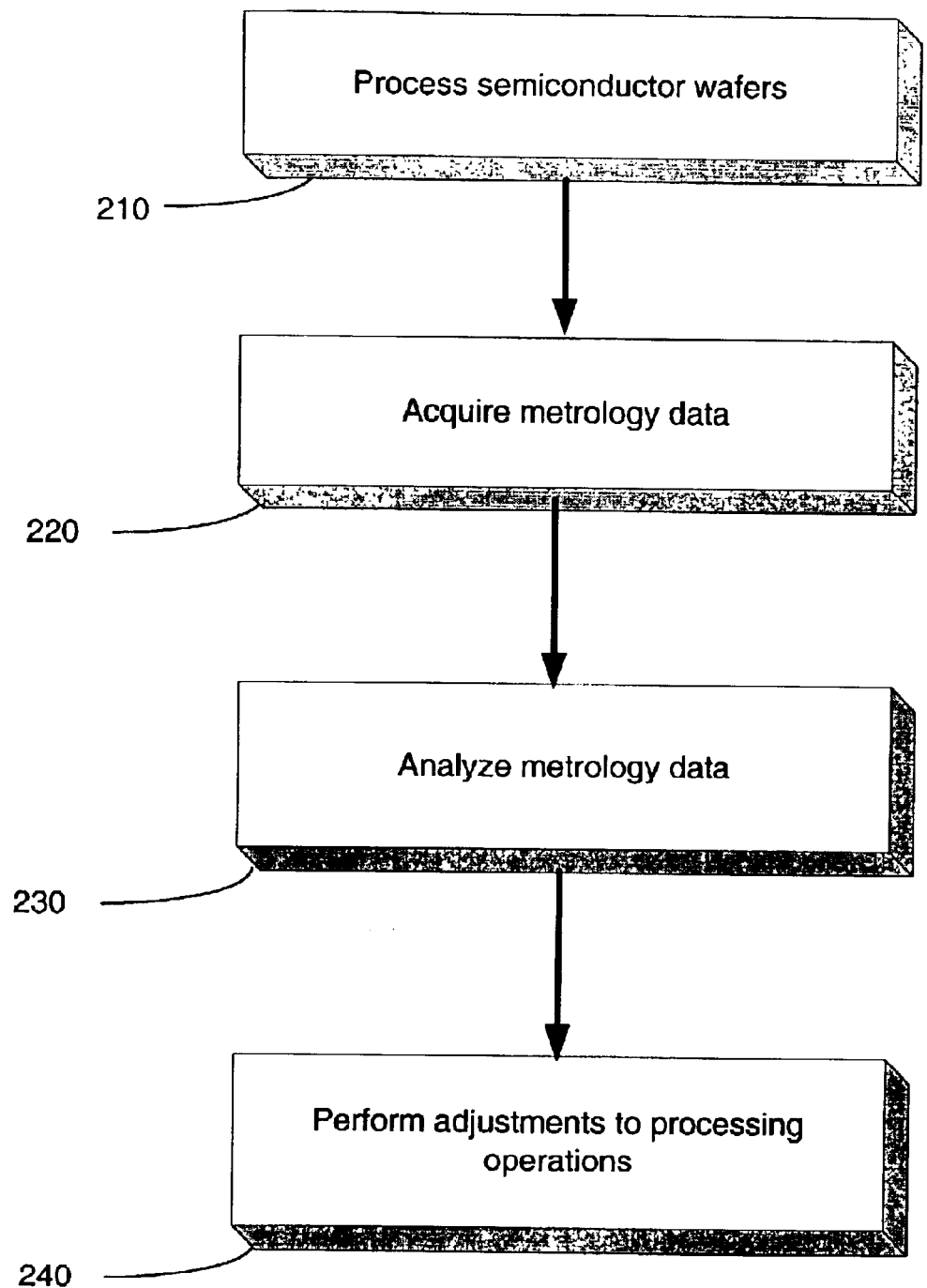
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for adjusting and controlling inline process parameters relating to processing of semiconductor wafers 105 based upon device operation features of devices produced from the processed semiconductor wafers 105. The operation parameters of a device, such erase time, data access time, and the like, may be affected by a plurality of inline parameters, which may be correlated to particular device operation parameters and controlled. Embodiments of the present invention may be used to control several inline parameters, such as shallow isolation trench (STI) critical dimension (CD) parameter(s), tunnel oxidation parameter(s), source/drain critical dimension(s), film stack measurement(s), post etch critical dimension measurement(s), wafer electrical test parameter(s), and the like, which may be adjusted and controlled based upon device operation parameters. Embodiments of the present invention provide for performing substantially real time adjustments in an inline fashion during a process flow, based upon device operation parameters of devices produced from the processed semiconductor wafers 105.

Figure 3:
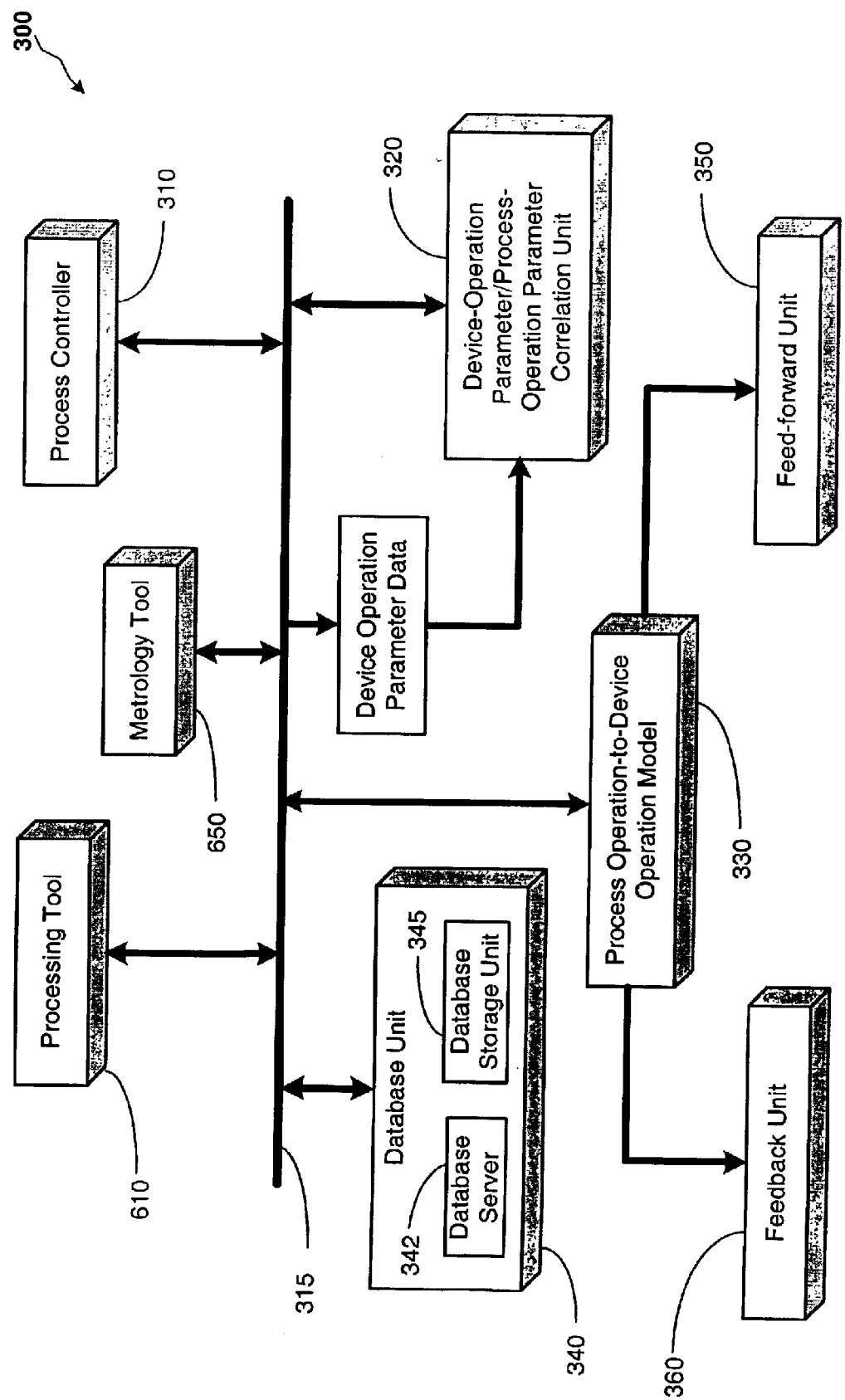
FIG. 3 provides a block diagram representation of a system in accordance with one illustrative embodiment of the present invention.

Turning now to FIG. 3, a block diagram depiction of a system 300 in accordance with embodiments of the present invention is illustrated. A process controller 310 in the system 300 is capable of controlling various operations relating to a processing tool 610. The system 300 is capable of acquiring manufacturing related data, such as metrology data, related to processed semiconductor wafers 105, tool state data, and the like. The system 300 may also comprise a metrology tool 650 to acquire metrology data related to the processed semiconductor wafers 105.

The system 300 may also comprise a database unit 340. The database unit 340 is provided for storing a plurality of types of data, such as manufacturing-related data, data related to the operation of the system 300 (e.g., the status of the processing tool 610, the status of semiconductor wafers 105, etc.). The database unit 340 may store tool state data relating to a plurality of process runs performed by the processing tool 610. The database unit 340 may comprise a database server 342 for storing tool state data and/or other manufacturing data related to processing semiconductor wafers 105, into a database storage unit 345.

The system 300 may receive device operation parameter data from a plurality of sources, such as the database unit 340 or external components that may provide such data. A device-operation parameter/process-operation parameter correlation unit 320 may correlate the device operation parameter data to one or more inline parameters that may be controlled by the system 300. For example, the device-operation parameter/process-operation parameter correlation unit 320 may correlate a plurality of inline parameters relating to processing of semiconductor wafers 105, such as the shallow-trench isolation (STI) critical dimension(s), the tunnel oxidization parameters, the first polygate critical dimension parameters, a source/drain critical dimension parameters, the oxide/nitride/oxide (ONO) film stack parameters, the post etch critical dimension parameters, and the like, to device operation parameters such as the erase time (EXE parameter) in memory devices such as flash memory devices.

The EXE parameters may provide an indication on how fast a write and an erase function performed upon a cell within a flash memory device may be executed, which may indirectly provide an indication of the power consumption of the flash memory device. The EXE parameter is an example of a device operation parameter that may be affected by the inline parameters described above. Based upon the correlation of the device operation parameter to the process operation parameter (inline parameters), which may be performed by the device-operation parameter/process-operation parameter correlation unit 320, a process operation-to-device operation model 330 may perform a modeling of a characterization of the possible device operation parameter(s) based upon the inline parameters described above. The process operation-to-device operation model 330 is described in a more detailed block diagram in FIG. 4 and accompanying description below.

Furthermore, the process operation-to-device operation model 330 may provide an indication of adjustments that may be made to one or more inline parameters based upon the device operation parameter data received by the system 300. Adjustment data from the process operation-to-device operation model 330 may be provided to a feedback unit 360 and/or to a feed forward unit 350. The feedback unit 360 is capable of receiving adjustment data and performing feedback adjustments to one or more processes performed by the manufacturing system 300. The adjustments may include modifying one or more control input parameters used to control process operations performed by the system. The feed-forward unit 350 is capable of performing compensation adjustments to processing steps based upon adjustment data received from the process operation-to-device operation model 330. Therefore, several inline parameters may be brought within a predetermined tolerance level to acquire a certain type of device operation parameter, such as an EXE parameter. Compensation adjustments made to subsequent processes performed on a previously processed semiconductor wafer 105 may be performed in a feed-forward manner.

The process controller 310, the device-operation parameter/process-operation parameter correlation unit 320, process operation-to-device operation model 330, the feedback unit 360, and/or feed forward unit 350, may be software, hardware, or firmware units that are standalone units or may be integrated into a computer system associated with the system 300. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Figure 4:
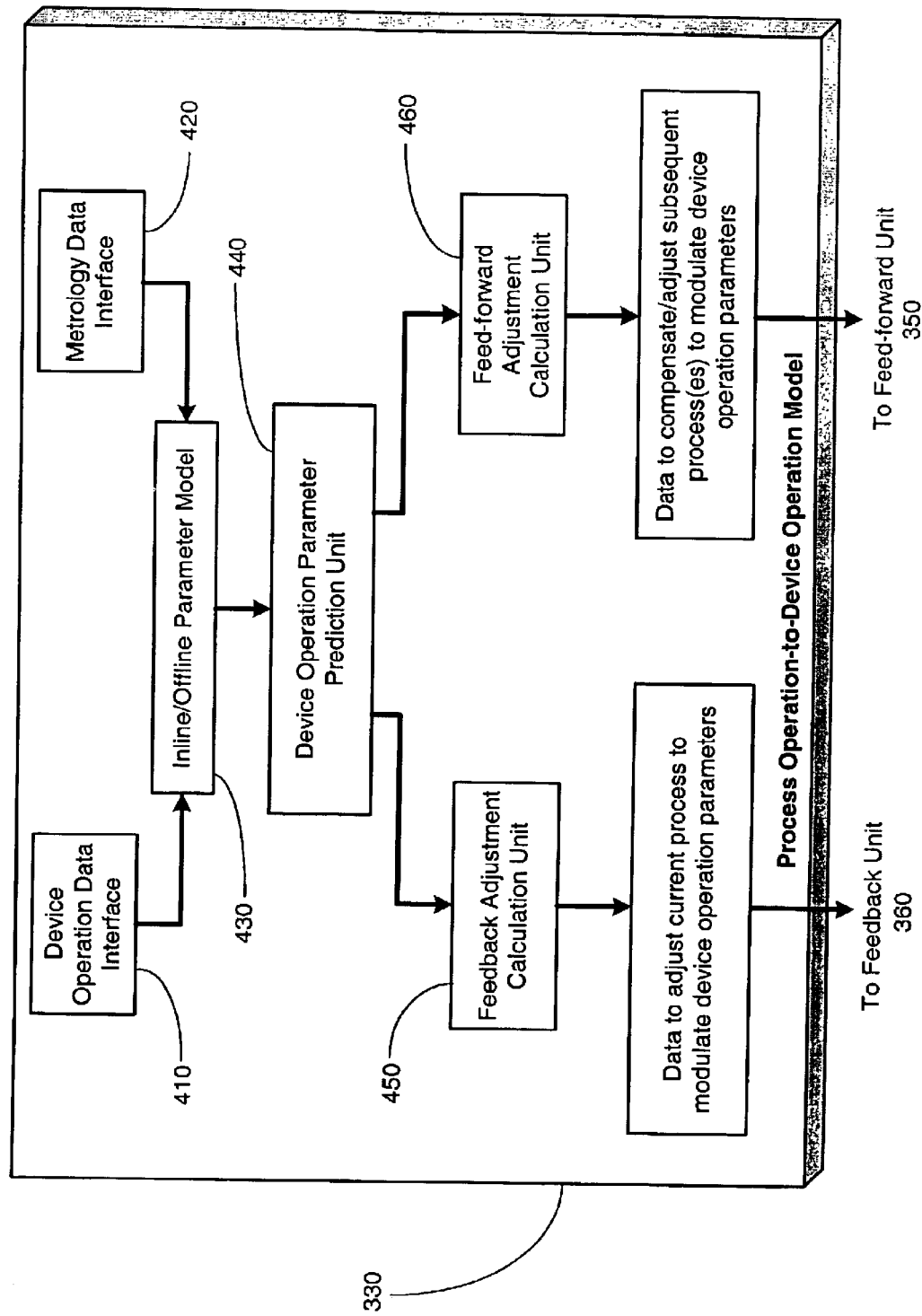
FIG. 4 illustrates a more detailed block diagram representation of a process operation-to-device operation model of FIG. 3, in accordance with one illustrative embodiment of the present invention.

Turning now to FIG. 4, a more detailed block diagram illustration of the process operation-to-device operation model 330 is provided. The process operation-to-device operation model 330 may comprise a device operation data interface 410 and a metrology data interface 420. The device operation data interface 410 is capable of receiving data relating to operation parameters of devices manufactured from processed semiconductor wafers 105 (device operation parameter data) from a plurality of sources such as the database unit 340 and/or external data sources. The metrology data interface 420 may receive metrology data from a plurality of sources, such as the database unit 340 and/or the metrology tool 650, in an inline fashion. An inline/offline parameter model 430 may model the behavior of one or more specific inline parameters to specific offline device operation parameters based upon the metrology data and the device operation data (modeling data). The inline/offline parameter model 430 is described in more detail in FIG. 5 and accompanying description below.

The modeling data from the inline/offline parameter model 430 may then be received by a device operation parameter prediction unit 440. Based upon the modeling of one or more inline parameters related to an offline device performance parameter, the device operation parameter prediction unit 440 may predict the value(s) of one or more device operation parameters, such as the EXE parameter, or other data-access parameters relating to a memory device. The device operation parameter prediction unit 440 is capable of predicting the possible device operation parameters based upon the current inline state of the semiconductor wafers 105 being processed by the system 300.

Based upon the device operation parameter prediction unit 440, a feedback adjustment calculation unit 450 may calculate feedback adjustment values that may be used to perform feedback adjustments upon processes to affect one or more inline parameters. The feed-forward adjustment calculation unit 460 may calculate several adjustment factors (feed-forward adjustment data) that may be used to modify the characteristics of several processed semiconductor wafers 105 using feed-forward adjustments. The feed-forward adjustments are generally performed through adjustments that are made to subsequent processes performed on the semiconductor wafers 105, in order to affect the device operation parameters.

Changes to the process in response to the feedback calculations and/or the feed-forward calculations may be made based upon a continual updating of the predicted device operation parameters provided by the device operation parameter prediction unit 440. The feedback adjustment calculation unit 450 provides feedback adjustment data to adjust the current process to modulate the device operation parameters to a desired range of tolerance. This data is sent to the feedback unit 360. The feed-forward adjustment calculation unit 460 may provide feed-forward data to adjust subsequent processes to modulate device operation parameters to be within a predetermined tolerance range, and provide such data to the feed-forward unit 350.

Figure 5:
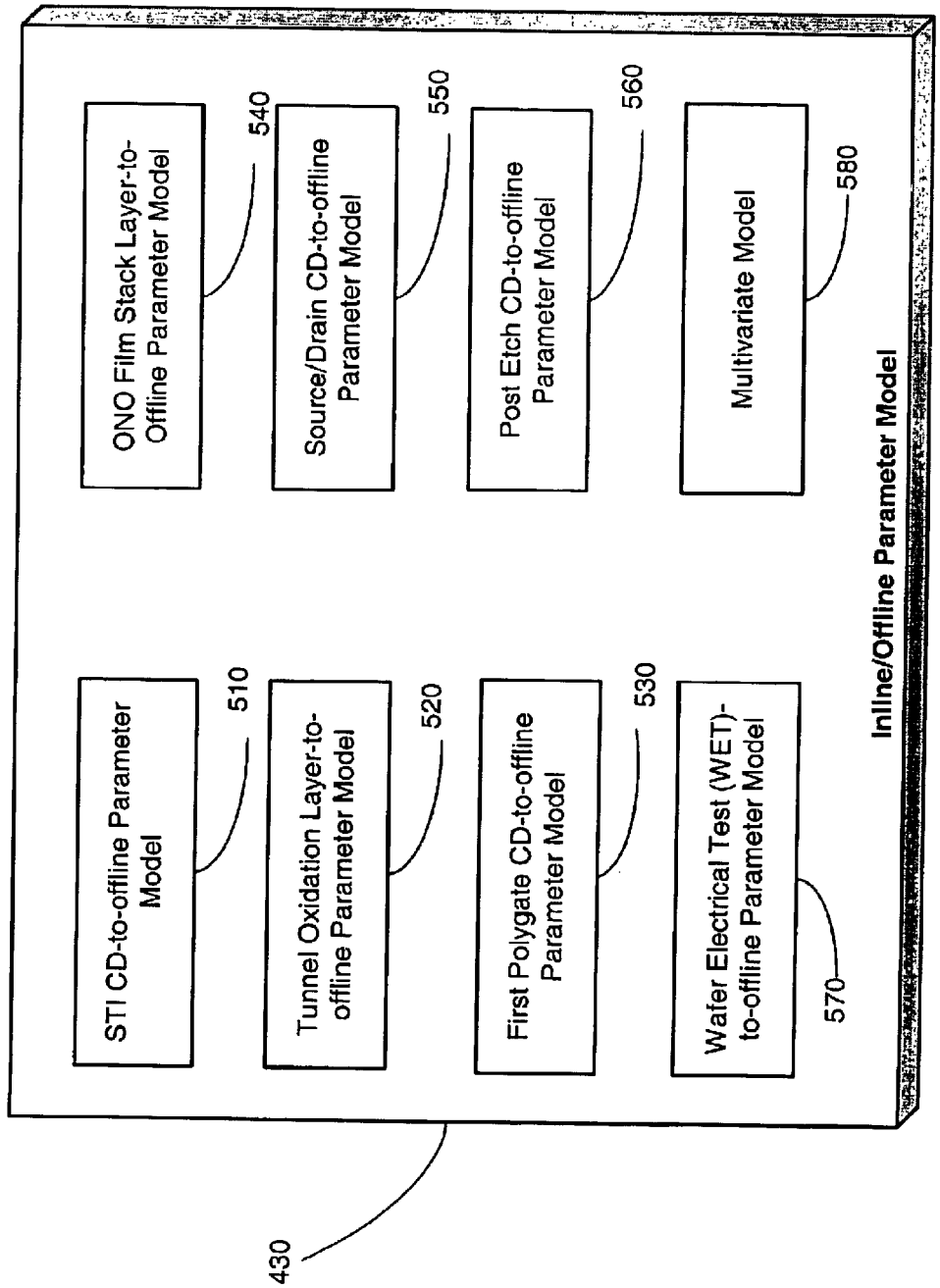
FIG. 5 illustrates a more detailed block diagram representation of an inline/offline parameter model of FIG. 3, in accordance with one illustrative embodiment of the present invention.

Turning now to FIG. 5, a more detailed block diagram depiction of the inline/offline parameter model 430 is provided. The inline/offline parameter model 430 may comprise a plurality of sub-models that are capable of modeling the behavior of particular inline parameters in relation to particular offline parameters. For example, the inline/offline parameter model 430 may comprise an STI CD-to-offline parameter model 510, a tunnel oxidation layer-to-offline parameter model 520, a first poly gate CD-to-offline parameter model 530, a source/drain CD-to-offline parameter model 550, an ONO film stack layer-to-offline parameter model 540, a post etch CD-to-offline parameter model 560, a wafer electrical test (WET)-to-offline parameter model 570, and/or a multivariate model.

The models 510–570 may provide a modeling of the behavior of particular inline parameters and/or which may result in certain offline parameters, such as the EXE parameter in a flash memory device. The models 510–570 may also model the behavior of one or more inline parameters based upon predicted or actual device performance parameters. The models 510–570 may receive inline parameter information from the metrology tool 650 and/or the database unit 340. The models 510–570, in one embodiment, may be used to affect the semiconductor wafers 105 such that devices manufactured from the processed semiconductor wafers 105 have more desirable operation parameters, such as improved EXE parameter(s). The model 510 may correlate one or more critical dimension measurements to one or more offline device operation parameters. The model 520 may correlate measurements relating to a tunnel oxidation layer to one or more offline device operation parameters. The model 530 may correlate polygate CD measurements to one or more offline device operation parameters. The model 540 may relate the thickness value of a ONO film stack layer to one or more offline device operation parameters. The ONO film stack layer generally refers to a dielectric layer that may comprise an $Si_3N_4$ layer that is positioned between two $SiO_2$ layers. The model 560 may correlate a CD value relating to a source/drain structure formed on a semiconductor wafer 105 to one or more offline device operation parameters. The model 570 may correlate various electrical measurement (e.g., drive current measurements, etc.) to one or more offline device operation parameters. The model 580 may correlate various inline parameters described above to one or more offline device operation parameters.

Figure 6:
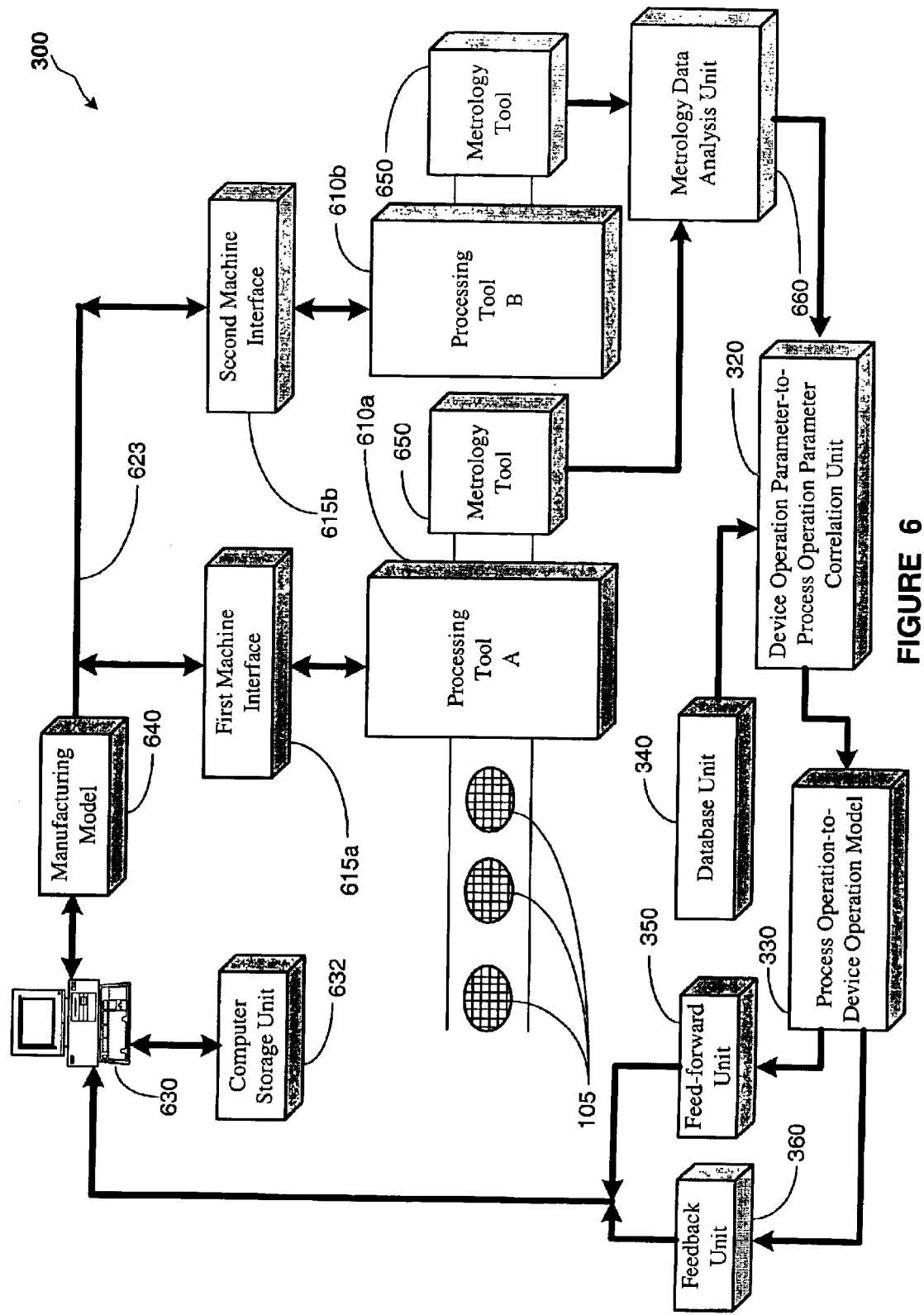
FIG. 6 illustrates a more detailed block diagram representation of the system shown in FIG. 3, in accordance with one illustrative embodiment of the present invention.

Turning now to FIG. 6, a more detailed block diagram of the system 300 in accordance with one embodiment of the present invention is illustrated. Semiconductor wafers 105 are processed on processing tools 610a, 610b using a plurality of control input signals, or manufacturing parameters, provided via a line or network 623. The control input signals, or manufacturing parameters, on the line 623 are sent to the processing tools 610a, 610b from a computer system 630 via machine interfaces 615a, 615b. The first and second machine interfaces 615a, 615b are generally located outside the processing tools 610a, 610b. In an alternative embodiment, the first and second machine interfaces 615a, 615b are located within the processing tools 610a, 610b. The semiconductor wafers 105 are provided to and carried from a plurality of processing tools 610. In one embodiment, semiconductor wafers 105 may be provided to a processing tool 610 manually. In an alternative embodiment, semiconductor wafers 105 may be provided to a processing tool 610 in an automatic fashion (e.g., robotic movement of semiconductor wafers 105). In one embodiment, a plurality of semiconductor wafers 105 is transported in lots (e.g., stacked in cassettes) to the processing tools 610.

In one embodiment, the computer system 630 sends control input signals, or manufacturing parameters, on the line 623 to the first and second machine interfaces 615a, 615b. The computer system 630 is capable of controlling processing operations. In one embodiment, the computer system 630 is a process controller. The computer system 630 is coupled to a computer storage unit 632 that may contain a plurality of software programs and data sets. The computer system 630 may contain one or more processors (not shown) that are capable of performing the operations described herein. The computer system 630 employs a manufacturing model 640 to generate control input signals on the line 623. In one embodiment, the manufacturing model 640 contains a manufacturing recipe that determines a plurality of control input parameters that are sent on the line 623 to the processing tools 610a, 610b.

In one embodiment, the manufacturing model 640 defines a process script and input control that implement a particular manufacturing process. The control input signals (or control input parameters) on the line 623 that are intended for processing tool A 610a are received and processed by the first machine interface 615a. The control input signals on the line 623 that are intended for processing tool B 610b are received and processed by the second machine interface 615b. Examples of the processing tools 610a, 610b used in semiconductor manufacturing processes are steppers, etch process tools, deposition tools, and the like.

One or more of the semiconductor wafers 105 that are processed by the processing tools 610a, 610b can also be sent to a metrology tool 650 for acquisition of metrology data. The metrology tool 650 may be a scatterometry data acquisition tool, an overlay-error measurement tool, a critical dimension measurement tool, and the like. In one embodiment, a metrology tool 650 examines one or more processed semiconductor wafers 105. The metrology data analysis unit 660 may collect, organize, and analyze data from the metrology tool 650. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 610.

As provided above, the device-operation parameter/process-operation parameter correlation unit 320 receives data from the database unit 340 and the metrology data analysis unit 660. The device-operation parameter/process-operation parameter correlation unit 320 correlates the inline metrology data and the device operation data and provides resultant data to the process operation-to-device operation model 330. The process operation-to-device operation model 330 may then perform modeling of a plurality of inline parameters in relation to device operation parameter(s) (e.g., EXE parameter, etc.) using parameter prediction data and/or by actual performance data. The process operation-to-device operation model 330 may then provide feedback data to the feedback unit 360 and/or feed-forward data to the feed-forward unit 350. The feed-forward unit 350 and the feedback unit 360 may then send data to the computer system 630 to implement feedback corrections to subsequent semiconductor wafers 105, and/or to implement feed-forward adjustment compensation to processed semiconductor wafers 105. The feedback and/or feed-forward adjustments may result in certain inline parameters being brought within acceptable tolerances such that device operation parameters have values that are within desired tolerance levels.

Figure 7:
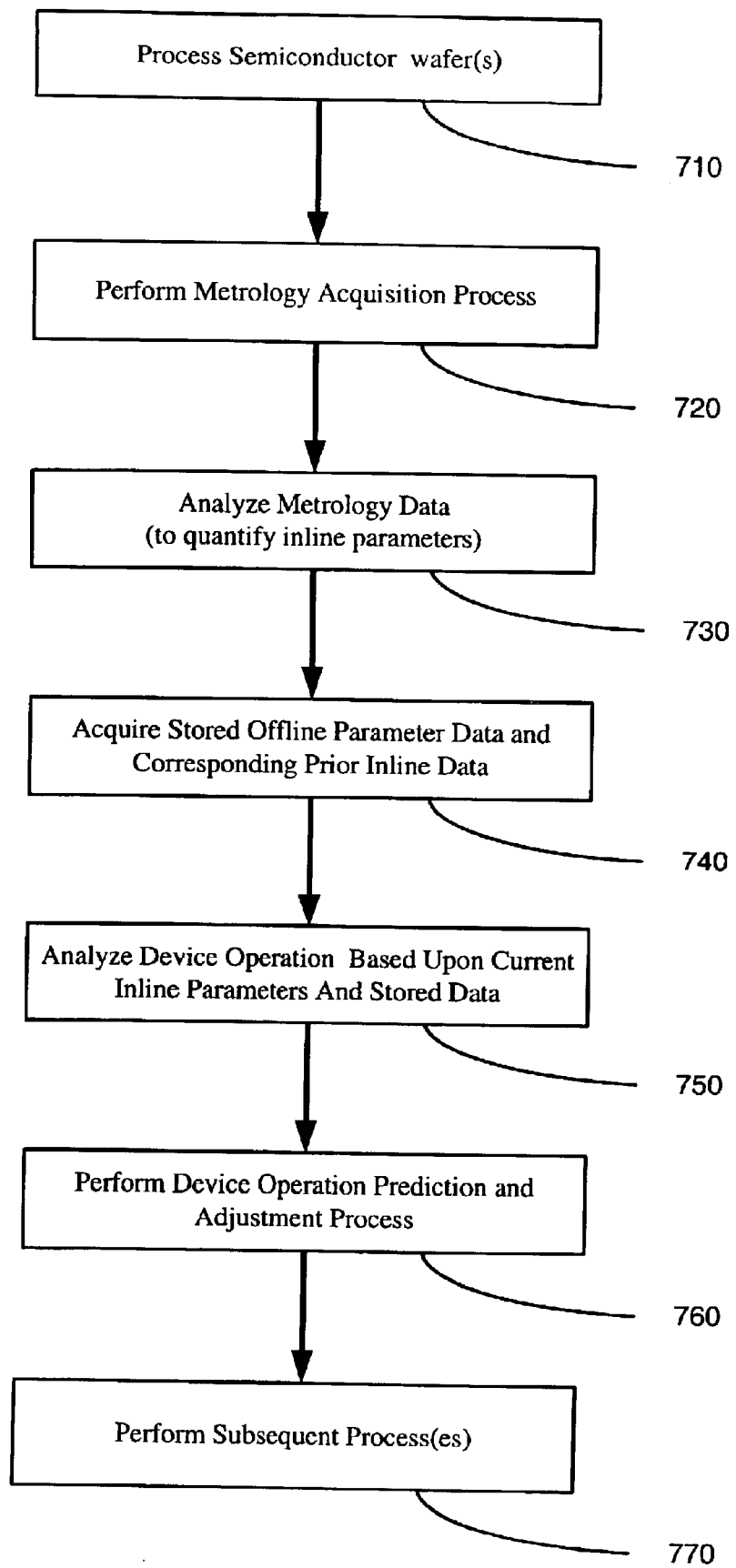
FIG. 7 illustrates a flowchart depiction of a method in accordance with one illustrative embodiment of the present invention.

Turning now to FIG. 7, a flowchart depiction of the method in accordance with embodiments of the present invention is illustrated. The system 300 may process one or more semiconductor wafers 105 that may be associated with a batch/lot of semiconductor wafers 105 (block 710). Upon processing the semiconductor wafers 105, the system 300 may acquire metrology data from one or more processed semiconductor wafers 105 (block 720). The system 300 may acquire metrology data from a sample of processed semiconductor wafers 105 and extrapolate inline metrology data to determine one or more inline parameters that may be representative of a group of processed semiconductor wafers 105. The system 300 may then analyze the acquired metrology data to quantify inline parameters related to the processed semiconductor wafer 105 (block 730).

The system 300 may store offline parameter data and acquire such data for analysis at a later time. The system 300 may acquire stored offline parameter data and corresponding prior inline data that may be correlated with stored offline parameter data (block 740). The system 300 may acquire current inline parameters on a real time or a near real time basis and correlate such data to certain offline parameters, such as device operation parameters. The system 300 may then perform an analysis of the device operation based upon current inline parameters and/or stored data that may provide additional inline parameters (block 750).

Upon analysis of the device operation, the system 300 may perform a device operation predicting and adjustment process (block 760). A more detailed description of the device operation prediction and adjustment process indicated in block 760 of FIG. 7 is provided in FIG. 8 and accompanying description below. The results of the device operation prediction and adjustment process include predicting possible device operation parameters and adjusting certain inline parameters, which may result in a determination of whether to perform adjustments to current processes based upon predicted device operation parameters, or continue current processing operations. Based upon the prediction and adjustment process of block 760, the system 300 may perform subsequent processing of semiconductor wafers 105 throughout the manufacturing facility associated with the system 300 (block 770). The process described in FIG. 7 may result in an increased number of devices produced from processed semiconductor wafers 105 that have device operation characteristics that are in predetermined tolerance ranges. Therefore, by adjusting one or more inline parameters based upon device operation analysis, more desirable manufacturing devices may be manufactured from semiconductor wafers 105, resulting in improved yields of devices and higher profitability.

Figure 8:
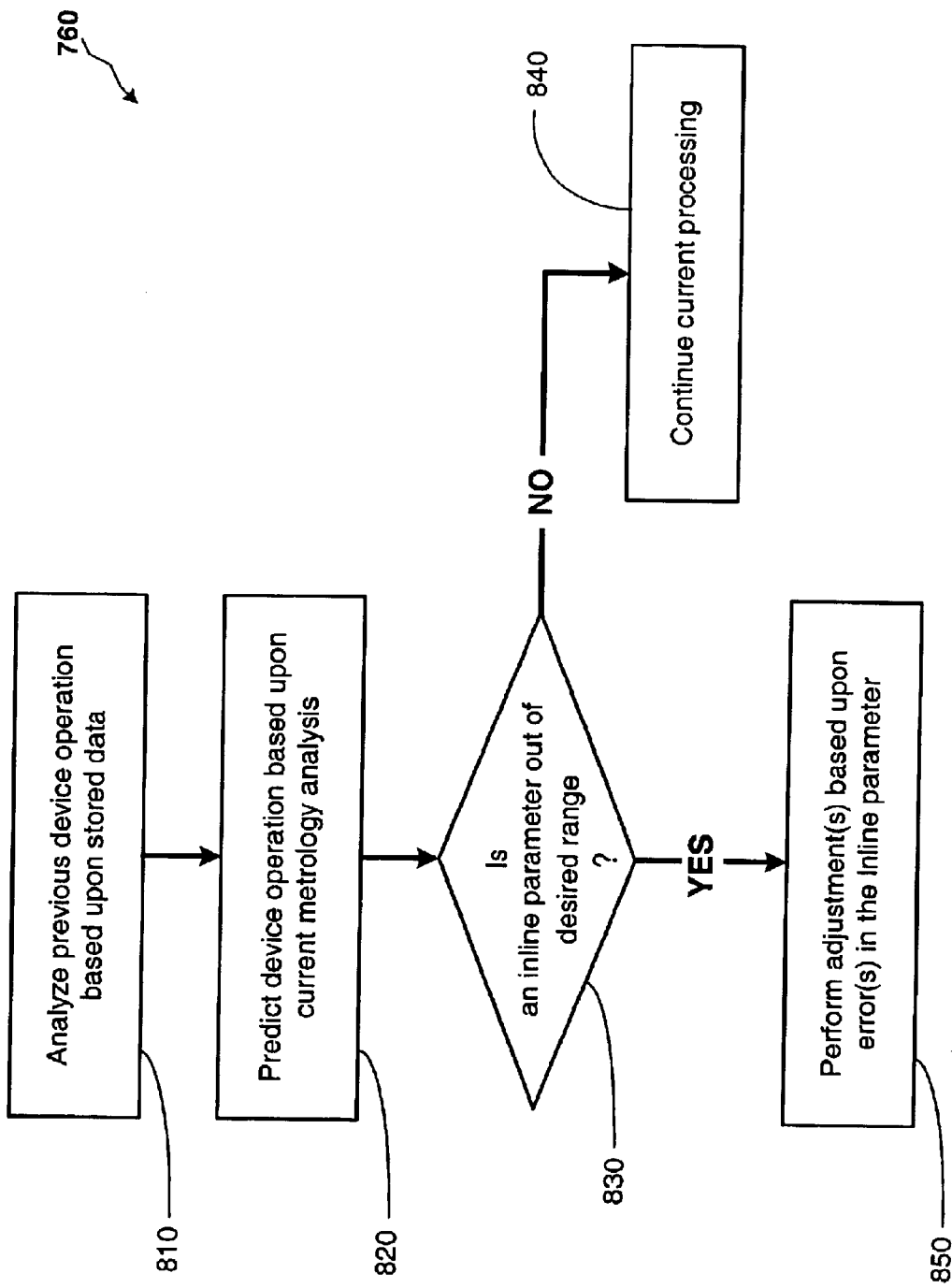
FIG. 8 illustrates a more detailed flowchart depiction of a method of performing a device operation prediction and adjustment process, as indicated in FIG. 7, in accordance with one illustrative embodiment of the present invention.

Turning now to FIG. 8, a more detailed flowchart illustration of the step of performing the device operation prediction and adjustment process indicated in block 760 of FIG. 7 is provided. The system 300 may analyze previous device operations based upon the stored data (block 810). Previous device operations may be correlated to previous inline parameters, therefore, a relationship between certain inline parameters and device operation parameters may be formulated for further prediction of possible device operation parameters. Based upon the analysis described above, the system 300 may predict device operation parameters of devices to be manufactured from currently processed semiconductor wafers 105 (block 820). This prediction of device operation parameters may be based upon current metrology analysis and may further be performed using the modeling processes described above. The process operation-to-device operation model 330, which may comprise the plurality of sub-models described above, may provide a relationship analysis between several inline parameters to device operation of devices manufactured from processed semiconductor wafers 105, such as memory devices, including flash memory devices.

Based upon the operation prediction described above, the system 300 may determine if one or more inline parameters is out of a desired range (block 830). In other words, the system 300 may analyze whether one or more inline parameters may cause the device operation parameter, such as the EXE parameter, to fall outside a desired range. The system 300 may analyze inline parameters and correlate them to predicted device operations. When the system 300 determines that one or more inline parameters may not be out of a desired range, the system 300 continues the current processing operations relating to the process flow in the system 300 (block 840). When the system 300 determines that one or more inline parameters may be outside of a desired range, the system 300 may perform adjustments to the process flow based upon the error discovered in one or more inline parameters (block 850). A more detailed description of the adjustments described in block 850 is provided in FIG. 9 and accompanying description below. The completion of the steps illustrated in FIG. 8, substantially completes the step of performing the device operation prediction and adjustment process indicated in block 760 of FIG. 7.

Figure 9:
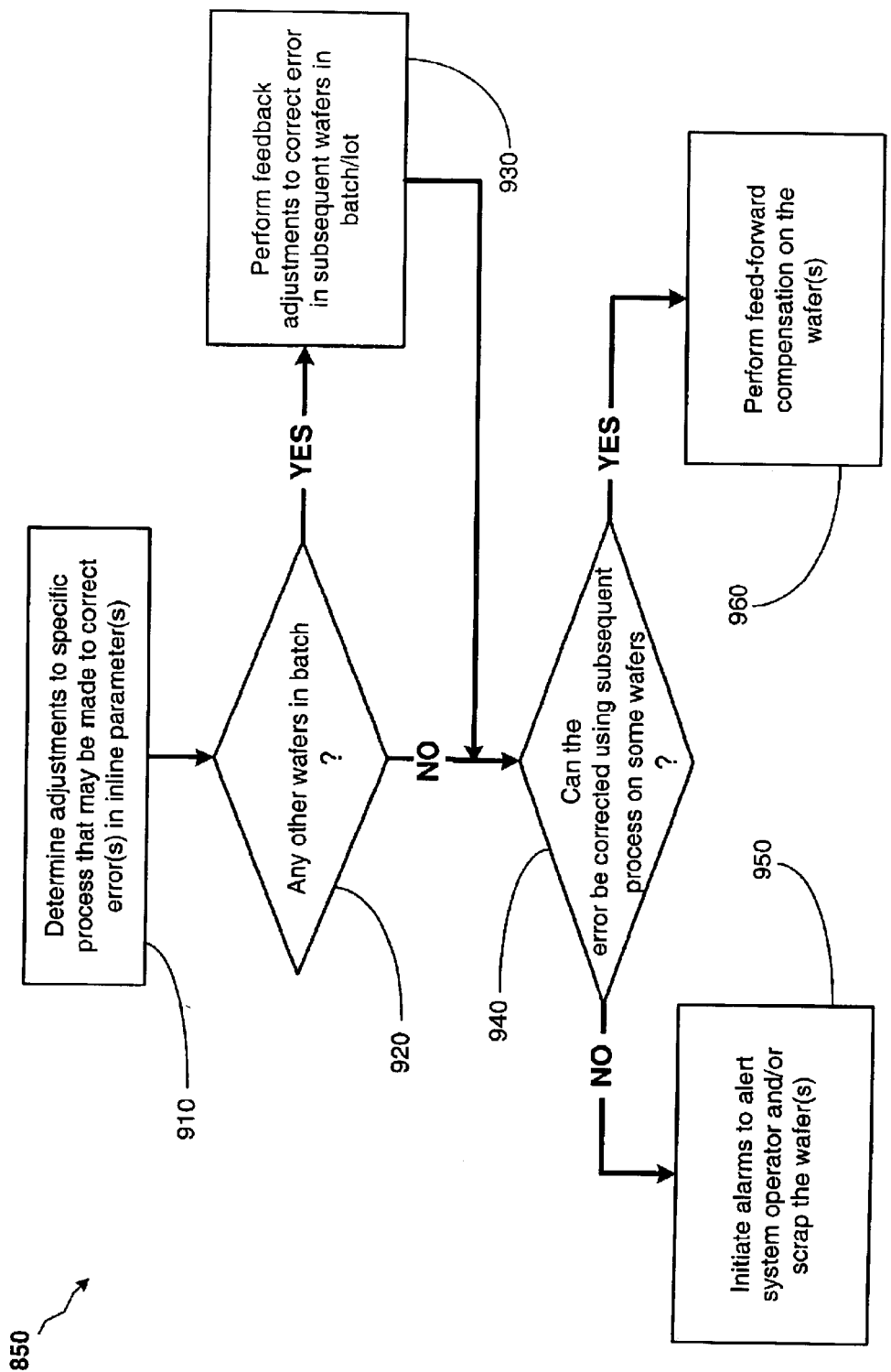
FIG. 9 illustrates a more detailed flowchart depiction of a method of performing adjustment(s) based upon an error in an inline parameter, as indicated in FIG. 8, in accordance with one illustrative embodiment of the present invention.

Turning now to FIG. 9, a flowchart depiction of the method for performing the adjustments performed by the system 300 described in block 850 of FIG. 8, is provided. The system 300 determines adjustments to be made to specific processes within the process flow of the system 300 that may be made to correct the calculated error in the inline parameter (block 910). For example, the system 300 may provide or determine adjustments that may be made to a single process within the process flow to correct or bring the inline parameter within the desired acceptable range. The system 300 makes a determination whether any semiconductor wafers 105 in a batch or a lot remains to be processed (block 920). When the system 300 determines that there are subsequent semiconductor wafers 105 in a batch/lot to be processed, the system 300 performs a feedback adjustment to correct the error on subsequent semiconductor wafers 105 in the batch (block 930). In this way, the subsequent semiconductor wafers 105 to be processed may be processed such that the inline error is not duplicated on those semiconductor wafers 105.

When the system 300 determines that there are no additional semiconductor wafers 105 in the batch to be processed, the system 300 may determine whether the error may be corrected using a subsequent process that may be performed on the processed semiconductor wafers 105 (block 940). When the system 300 determines that additional processes may not be efficiently used to correct the detected errors on the semiconductor wafers 105, an alarm may be initiated to alert the system operator (block 950). The operator may decide to scrap the semiconductor wafers 105 or rework the semiconductor wafers 105 based upon many factors, such as business rules, which may include factors such as the value of the semiconductor wafers 105, the acceptable degradation in the devices manufactured from the semiconductor wafers 105, the cost of the devices, etc. When the system 300 determines that subsequent errors may be used to correct the inline errors on the processed semiconductor wafers 105, the system 300 may perform feed-forward compensation on the semiconductor wafers 105 to correct such errors (block 960). Based upon the feedback and/or feed-forward adjustment data, the inline parameters may be corrected such that predicted device operation parameters may be brought within an acceptable range of tolerance. The completion of the steps described in FIG. 9 substantially completes the step of performing adjustments based upon the error in the inline parameters as indicated in block 850 of FIG. 8.

Utilizing embodiments of the present invention, a more efficient set of devices produced from processed semiconductor wafers 105 may be realized. Adjusting inline parameters to bring particular device operation parameters, such as the EXE parameters of a flash memory device, may be performed to increase the yield of devices that operate within acceptable and predetermined tolerances. Therefore, profitable devices, whose operations may depend or indicate how profitable a particular device may be, may be processed in a more efficient manner utilizing embodiments of the present invention.

The principles taught by the present invention can be implemented in an Advanced Process Control (APC) Framework, such as a CATALYST™ system offered by KLA TENCOR, INC. The CATALYST™ system uses Semiconductor Equipment and Materials International (SEMI) Computer Integrated Manufacturing (CIM) Framework compliant system technologies, and is based on the Advanced Process Control (APC) Framework. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

receiving inline parameter data relating to a processed workpiece;

determining whether said inline parameter would result in a device operation that would be performed within a predetermined range; and adjusting at least one process operation performed upon said workpiece in response to a determination that said inline parameter would not result in a value of said device operation within said predetermined range.

2. The method of claim 1, wherein performing said process step upon said workpieces further comprises performing said process step upon a semiconductor wafer.

3. The method of claim 2, wherein receiving inline parameter data relating to a processed workpiece further comprises receiving at least one of a shallow isolation trench critical dimension, a tunnel oxidation parameter, a source/drain critical dimension, a film stack measurement, a post etch critical dimension measurement, and a wafer electrical test parameter relating to said processed workpiece.

4. The method of claim 3, wherein determining whether said inline parameter would result in a value of a device operation parameter within a predetermined range further comprises modeling said device operation parameter with at least one of said shallow isolation trench critical dimension, said tunnel oxidation parameter, said source/drain critical dimension, said film stack measurement, said post etch critical dimension measurement, and said wafer electrical test parameter.

5. The method of claim 4, wherein determining whether said inline parameter would result in a value of a device operation parameter within a predetermined range further comprises determining whether said inline parameter would result in an erase time parameter relating to a memory device that is within a predetermined range.

6. The method of claim 4, wherein determining whether said inline parameter would result in a value of a device operation parameter within a predetermined range further comprises predicting whether said device operation parameter is within a predetermined range based upon said inline parameter.

7. The method of claim 2, wherein adjusting at least one process operation performed upon said workpiece further comprises performing a feedback adjustment.

8. The method of claim 2, wherein adjusting at least one process operation performed upon said workpiece further comprises performing a feed-forward adjustment.

9. A method, comprising:
receiving inline parameter data relating to a processed workpiece, said inline parameter comprises at least one of a shallow isolation trench critical dimension, a tunnel oxidation parameter, a source/drain critical dimension, a film stack measurement, a post etch critical dimension measurement, and a wafer electrical test parameter relating to said processed workpiece;
determining whether said inline parameter would result in a device operation that would be performed within a predetermined range; and
adjusting at least one process operation performed upon said workpiece in response to a determination that said inline parameter would not result in a value of said device operation within said predetermined range.

10. A method, comprising:
receiving inline parameter data relating to a processed workpiece, said inline parameter comprises at least one of a shallow isolation trench critical dimension, a tunnel oxidation parameter, a source/drain critical dimension, a film stack measurement, a post etch critical dimension measurement, and a wafer electrical test parameter relating to said processed workpiece;
determining whether said inline parameter would result in a erase time value relating to a memory device that is within a predetermined range; and
performing at least one of a feedback adjustment and a feed-forward adjustment upon a process performed upon said workpiece in response to a determination that said inline parameter would not result in a value of said erase time value that is within said predetermined range.

11. An apparatus, comprising:
means for receiving inline parameter data relating to a processed workpiece;
means for determining whether said inline parameter would result in a device operation that would be performed within a predetermined range; and
means for adjusting at least one process operation performed upon said workpiece in response to a determination that said inline parameter would not result in a value of said device operation.

12. A system, comprising:
a processing tool to process a workpiece; and
a process controller operatively coupled to said processing tool, said process controller being adapted to receive inline parameter data relating to said processed workpiece and determine whether said inline parameter would result in a device operation that would be performed within a predetermined range, said process controller further adapted to adjust at least one process operation performed upon said workpiece in response to a determination that said inline parameter would not result in a value of said device operation.

13. The system of claim 12, wherein said workpiece is a semiconductor wafer.

14. The system of claims 13, further comprising:
a metrology tool operatively coupled to said process controller and to said processing tool, said metrology tool to acquire metrology data relating to said processed workpiece;
a device operation parameter/process-operation parameter correlation unit operatively coupled to said process controller, said device operation parameter/process-operation parameter to correlate said device operation parameter to said inline parameter; and
a process operation-to-device operation model operatively coupled to said process controller, said process operation-to-device operation model to predict said device operation parameter based upon said inline parameter.

15. The system of claim 14, wherein said process operation-to-device operation model comprises at least one of a shallow trench isolation critical dimension-to-offline parameter model, a tunnel oxidation layer-to-offline parameter model, a first poly gate CD-to-offline parameter model, a source/drain CD-to-offline parameter model, an oxide-nitride-oxide film stack layer-to-offline parameter model, a post etch CD-to-offline parameter model, a wafer electrical test (WET)-to-offline parameter model, and a multivariate model, and modeling said inline parameter to an offline parameter relating to a device manufactured from said processed workpiece.

16. The system of claim 14, further comprising:
a feedback unit operatively coupled to said process operation-to-device operation model, said feedback unit to perform a feedback correction based upon an analysis provided by process operation-to-device operation model; and
a feed-forward unit operatively coupled to said process operation-to-device operation model, said feed-forward unit to perform a feed-forward correction based upon an analysis provided by process operation-to-device operation model.

17. The system of claim 12, further comprising a database unit to store said at least one of metrology data, said inline parameter, and modeling data relating to modeling said inline parameter to said device operation parameter.

18. An apparatus, comprising:
a process controller being adapted to receive inline parameter data relating to a processed workpiece and determine whether said inline parameter would result in a device operation that would be performed within a predetermined range, said process controller further adapted to adjust at least one process operation performed upon said workpiece in response to a determination that said inline parameter would not result in a value of said device operation.

19. The apparatus of claims 18, further comprising:
a metrology tool operatively coupled to said process controller and to said processing tool, said metrology tool to acquire metrology data relating to said processed workpiece;
a device operation parameter/process-operation parameter correlation unit operatively coupled to said process controller, said device operation parameter/process-operation parameter to correlate said device operation parameter to said inline parameter; and a process operation-to-device operation model operatively coupled to said process controller, said process operation-to-device operation model to predict said device operation parameter based upon said inline parameter.

20. The apparatus of claim 19, wherein said process operation-to-device operation model comprises at least one of a shallow trench isolation critical dimension-to-offline parameter model, a tunnel oxidation layer-to-offline parameter model, a first poly gate CD-to-offline parameter model, a source/drain source CD-to-offline parameter model, an oxide-nitride-oxide film stack layer-to-offline parameter model, a post etch CD-to-offline parameter model, a wafer electrical test (WET)-to-offline parameter model, and a multivariate model, and modeling said inline parameter to an offline parameter relating to a device manufactured from said processed workpiece.

21. The apparatus of claim 20, further comprising:
a feedback unit operatively coupled to said process operation-to-device operation model, said feedback unit to perform a feedback correction based upon an analysis provided by process operation-to-device operation model; and
a feed-forward unit operatively coupled to said process operation-to-device operation model, said feed-forward unit to perform a feed-forward correction based upon an analysis provided by process operation-to-device operation model.

22. The apparatus of claim 18, further comprising a database unit to store said at least one of metrology data, said inline parameter, and modeling data relating to modeling said inline parameter to said device operation parameter.

23. A computer readable program storage device encoded with instructions that, when executed by a computer, performs a method, comprising:
receiving inline parameter data relating to a processed workpiece;
determining whether said inline parameter would result in a device operation that would be performed within a predetermined range; and
adjusting at least one process operation performed upon said workpiece in response to a determination that said inline parameter would not result in a value of said device operation.

24. The computer readable program storage device encoded with instructions that, when executed by a computer, performs the method of claim 23, wherein performing said process step upon said workpieces further comprises performing said process step upon a semiconductor wafer.

25. The computer readable program storage device encoded with instructions that, when executed by a computer, performs the method of claim 24, wherein receiving inline parameter data relating to a processed workpiece further comprises receiving at least one of a shallow isolation trench critical dimension, a tunnel oxidation parameter, a source/drain critical dimension, a film stack measurement, a post etch critical dimension measurement, and a wafer electrical test parameter relating to said processed workpiece.

26. The computer readable program storage device encoded with instructions that, when executed by a computer, performs the method of claim 25, wherein determining whether said inline parameter would result in a value of a device operation parameter within a predetermined range further comprises modeling said device operation parameter with at least one of said shallow isolation trench critical dimension, said tunnel oxidation parameter, said source/drain critical dimension, said film stack measurement, said post etch critical dimension measurement, and said wafer electrical test parameter.

27. The computer readable program storage device encoded with instructions that, when executed by a computer, performs the method of claim 26, wherein determining whether said inline parameter would result in a value of a device operation parameter within a predetermined range further comprises determining whether said inline parameter would result in a erase time parameter relating to a memory device that is within a predetermined range.

28. The computer readable program storage device encoded with instructions that, when executed by a computer, performs the method of claim 26, wherein determining whether said inline parameter would result in a value of a device operation parameter within a predetermined range further comprises predicting whether said device operation parameter is within a predetermined range based upon said inline parameter.

29. The computer readable program storage device encoded with instructions that, when executed by a computer, performs the method of claim 24, wherein adjusting at least one process operation performed upon said workpiece further comprises performing a feedback adjustment.

30. The computer readable program storage device encoded with instructions that, when executed by a computer, performs the method of claim 24, wherein adjusting at least one process operation performed upon said workpiece further comprises performing a feed-forward adjustment.

* * * * *